(12) United States Patent
Trovato

(10) Patent No.: US 6,324,476 B1
(45) Date of Patent: *Nov. 27, 2001

(54) METHOD AND APPARATUS FOR IDENTIFYING OR CONTROLLING TRAVEL TO A RENDEZVOUS

(75) Inventor: Karen I. Trovato, Putnam Valley, NY (US)

(73) Assignee: Philips ElectronicsNorth America Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/360,186

(22) Filed: Dec. 20, 1994

Related U.S. Application Data (63) Continuation of application No. 08/007,688, filed on Jan. 22, 1993, now abandoned, which is a continuation-in-part of application No. 07/879,702, filed on May 5, 1992, now abandoned, which is a continuation of application No. 07/646,516, filed on Jan. 25, 1991, now abandoned, which is a continuation of application No. 07/290,130, filed on Dec. 23, 1988, now abandoned, and application No. 07/166,599, filed on Mar. 9, 1988, now Pat. No. 4,949,277, and application No. 07/123,502, filed on Nov. 20, 1987, now abandoned, application No. 08/360,186, which is a continuation-in-part of application No. 07/966,221, filed on Oct. 26, 1992, and application No. 07/605,057, filed on Oct. 29, 1990, now Pat. No. 5,220,497, application No. 08/360,186, which is a continuation-in-part of application No. 08/101,336, filed on Aug. 2, 1993, now abandoned, which is a continuation of application No. 07/879,702, and application No. 07/508,024, filed on Apr. 11, 1990, which is a continuation of application No. 07/166,599.

(51) Int. Cl.[7] .................................................. G06F 19/00
(52) U.S. Cl. ........................ 701/301; 700/245; 701/23; 701/41; 701/300; 701/302
(58) Field of Search ............... 364/148, 424.02, 364/47.2, 444, 461, 167.01, 436, 437, 438; 395/919, 905, 920, 80, 85, 88, 90, 89; 701/23–28, 201, 202; 700/28, 18, 177, 178, 245, 250, 253, 255, 254, 87, 56–66; 702/201, 202, 117, 118, 119; 706/919, 905, 920

(56) References Cited

U.S. PATENT DOCUMENTS

| | | | |
|---|---|---|---|
| 4,481,568 | * 11/1984 | Inaba et al. | 364/474.2 X |
| 4,482,968 | * 11/1984 | Inaba et al. | 364/474.2 X |
| 4,674,048 | * 6/1987 | Okumura | 364/424.02 |
| 4,764,873 | * 8/1988 | Libby | 364/461 |
| 4,949,277 | 8/1990 | Trovato et al. | 364/513 |
| 5,083,256 | 1/1992 | Trovato et al. | 364/148 |
| 5,187,667 | * 2/1993 | Short | 701/200 |
| 5,544,282 | * 8/1996 | Chen et al. | 700/255 |
| 5,610,821 | * 3/1997 | Gazis et al. | 455/456 |
| 5,696,674 | * 12/1997 | Trovato et al. | 345/473 |
| 5,835,684 | * 11/1998 | Bourne et al. | 700/255 |
| 5,870,303 | * 2/1999 | Trovato et al. | 700/255 |

OTHER PUBLICATIONS

Houghton Mifflin Company, 'The American Heritage® Dictionary of the English Language', Electronic Version Licensed to INSO Corporation, 1992.*

* cited by examiner

Primary Examiner—Reba I. Elmore
(74) Attorney, Agent, or Firm—Michael E. Marion (57) ABSTRACT

Paths are planned for one or more actors, through at least two dimensions of time or space, to identify rendezvous locations meeting a global criterion. At least two scenarios are defined, including at least one for each actor, and a configuration space is created for each of these scenarios. A scenario includes identification of the actor, a source direction for planning, a set of states identifying the source or obstacle locations, and the respective cost metrics for each possible transition between a configuration state in the corresponding configuration space, and its neighbors. Cost waves are propagated in each configuration space, to generate a cost-to-source for each state. A Boolean evaluation is then made of configuration states, according to a global criterion, to identify all possible rendezvous states. Finally, the actors are controlled to travel to that rendezvous chosen according to optimization criteria, or the candidate rendezvous states are displayed for further evaluation or use.

29 Claims, 4 Drawing Sheets

METHOD AND APPARATUS FOR IDENTIFYING OR CONTROLLING TRAVEL TO A RENDEZVOUS

RELATED APPLICATIONS

The following patents and applications are hereby incorporated by reference:

The present application is a continuation of application Ser. No. 08/007,688, filed Jan. 22, 1993, now abandoned, which is now U.S. patent application Ser. No. 07/879,702 filed May 5, 1992 (now abandoned), which is a continuation of Ser. No. 07/646,516 filed Jan. 25, 1991 (now abandoned), which is a continuation of Ser. No. 07/290,130 filed Dec. 23, 1988 (now abandoned), which is a continuation-in-part of Ser. No. 07/123,502 filed Nov. 20, 1987 (now abandoned) and of Ser. No. 07/166,599 filed Mar. 9, 1988 (now U.S. Pat. No. 4,949,277); of Ser. No. 07/605,057 filed Oct. 29, 1990 (now U.S. Pat. No. 5,220,497); and of Ser. No. 07/966,221 filed Oct. 26, 1992, now U.S. Pat. No. 5,663,879. Application Ser. No. 08/101336 filed Aug. 2, 1993 abandoned, is a continuation of Ser. No. 07/879,702. Application Ser. No. 07/508,024 filed Apr. 11, 1990 pending and is a continuation of Ser. No. 07/166,599 patented.

BACKGROUND OF THE INVENTION

1. Field of the Invention

The invention relates to planning maneuvers of one or more actors (machines or people), where movement is possible in at least two dimensions, and is subject to two independent space-variant constraints or scenarios. In particular, the invention is applicable to planning travel, for example through time or space, where a rendezvous is required between one actor and another actor or condition which is also moving through the time or space.

The most common application for path planning has been for controlling robots. In the typical robot path plan, a path is chosen to get the robot (or a portion of it, such as a gripping member) from a start point to a goal point while avoiding obstacles. Computer simulation/control has been one of the great advances in improving performance, particularly in multidimensional situations.

Other applications of the invention may lie in traffic or emergency vehicle controls or planning or predicting possible routes or activities of people or machines in dynamic situations.

2. Description of the Prior Art

The related applications listed above form a background to the invention. These applications disclose, among other things, propagating cost waves through a configuration space by budding, using a space-variant metric. In simple path-planning problems, the configuration space represents a two-dimensional physical condition which has been discretized. Using a typical rectangular coordinate system, each configuration state then represents a task state or physical condition which is described by various parameters having known values. A list of these values in a specific order, known as a tuple, describes each configuration state. The configuration space, then, covers or is the span of the tuples.

Goal locations or states are defined, and are fixed for a set of analyses. Selection of a starting position is one step of the planning method.

The cost of transition from one configuration state to another, known as a cost metric but also referred to herein simply as a metric, is defined for each configuration state in a configuration space, with respect to each of its neighbors. Where it is impossible or highly undesirable for an actor (e.g., a machine) to be in a particular configuration state, that state is considered an obstacle. Movement into that state may then be associated with a very high, or infinite, transition cost. The neighborhood may then be defined as including only those states whose transition cost is undefined, or has a finite value—that is, a permissible state change.

Budding starts at a source, usually the goal or goals in a given configuration space, and is used to generate a direction arrow and a cost-to-goal metric for each state, in a wave of calculations expanding from the goal. A graphical view of this expansion process gives rise to the term "cost wave propagation." The direction arrows generated for each configuration space point back to the lowest cost path to the goal. In control processes for robots, this has the advantage that, in the event that the robot has deviated from the optimum path, identification of the state it is in immediately makes the new best path direction known.

A specific improvement to the budding process, described in U.S. Pat. No. 4,949,277, involves differential budding of only a small part of the configuration space when, for example, an obstacle or goal is added to, moved a small distance in, or removed from that space.

U.S. Pat. No. 5,083,256, a continuation-in-part of Ser. No. 166,599 referred to above, discloses a variation of differential budding which takes into account changes in transitions in a configuration space, rather than just changes in the states themselves.

SUMMARY OF THE INVENTION

An object of the invention is to identify a plurality of rendezvous regions within a larger space, in which a planned rendezvous satisfies global constraints.

Another object of the invention is to utilize cost wave propagation from different sources in a more efficient way.

Yet another object of the invention is to optimize paths for at least two actors between separate starting locations and a rendezvous, and for at least one of these actors from the rendezvous to a final goal.

A further object of the invention is to control an actor machine to follow an optimized path from a start to a rendezvous to a final goal.

A still further object of the invention is to provide an apparatus which displays rendezvous regions for at least two actors, which satisfy all global constraints, Still another object of the invention is to provide an apparatus for controlling an actor machine to follow an optimized path from a start to a rendezvous to a final goal with efficient updating when the environment changes According to the invention, configuration spaces are formed for each of the scenarios applicable to the respective actors, with obstacles and goals defined in the configuration spaces. Cost waves are then propagated in each of the configuration spaces, and the costs for each of the configuration states are stored. Separate Boolean evaluations are made for each task state which is valid for the respective actors, to identify the candidate rendezvous states, which are those that meet the global criterion for a rendezvous. The Boolean results are then the basis for providing this identification.

In a first preferred apparatus embodying the invention, responsive to the Boolean results, an apparatus provides control signals for an actor to optimize travel from that actor's start to a rendezvous location.

In another preferred embodiment, an apparatus provides a visual display, pictorial or as a list of setpoints, of the candidate rendezvous regions.

DESCRIPTION OF THE PREFERRED EMBODIMENT

It is common that multiple machines should be coordinated to achieve a larger goal. Typically this involves meeting at a mutually acceptable location (or state). The acceptable region for a specific machine is described in terms of a global constraint. The mutually acceptable locations are referred to as rendezvous locations. Often, only one of these is selected for actual implementation.

Figure 1:
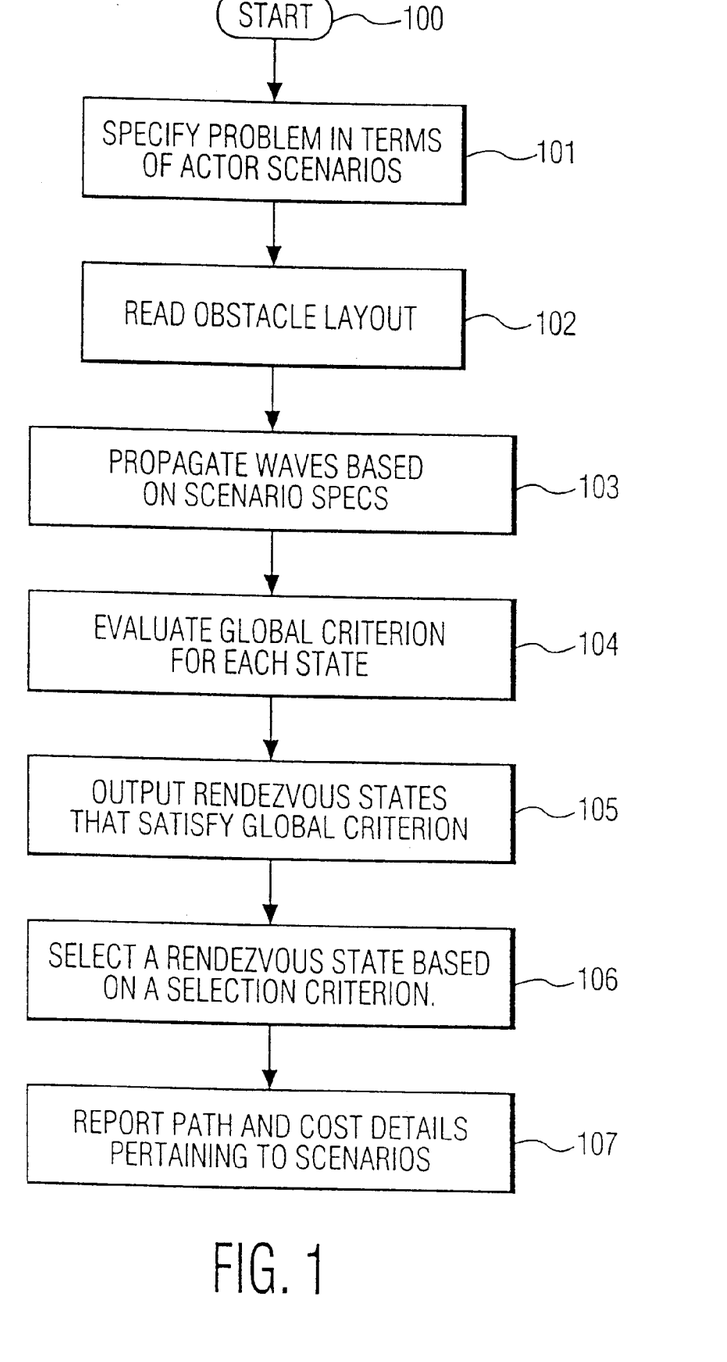
FIG. 1 is a flow diagram showing the basic steps of the method according to the invention.

FIG. 1 describes the most general method for finding a rendezvous region. Oval 100 indicates the start of the method.

In box 101, actor scenarios are specified. For each scenario specified, a configuration space is created. Typically, the configuration space represents a common region of activity for all the actors. For example, 4 different kinds of trucks (each with their own kinematics and costs) may be driving along the same expanse of desert. Each scenario includes: a name of the scenario which typically also indicates which actor is involved; a source direction for planning, i.e. start or goal; a set of states specifically identifying the source locations; and a metric used to govern the search. While in carrying out a maneuver, there is only one start, there may be more than one alternative start if a plan is to be evaluated.

In box 102, the obstacles are transformed into the configuration space.

In box 103, cost waves are propagated for each scenario according to the specification given in box 101. The source direction is different from the past references to 'start' and 'goal' in that a single path was immediately found between a goal and any starting state. In this situation, waves are propagated outward from the goal as before if the source direction is 'goal'. If the source direction is 'start' though, the waves propagate from the start state, the costs are measured as 'cost_from_start'. This means cost_from_ start for the starting state is zero, and calls to the metric function are reversed, e.g.: instead of dist(a,b) dist(b,a) is called, and the arrows point toward rather than away from the start. The mechanism for cost wave propagation is the same except for these differences. Wave Propagation from the start is described at the end of the aforementioned application Ser. No. 123,505 abandoned.

In box 104, the global criterion is evaluated at each configuration state.

In box 105, the rendezvous states that satisfy the global criterion are output. The global criterion is a boolean expression that encompasses all the ways that a satisfactory solution could be achieved.

For example, if at least one of two fuel trucks and an airplane must rendezvous so that the plane (fuel cost metric measured in scenario A) still has at least 100 gallons of fuel in its tank, and the first fuel truck (distance cost metric measured in scenario F1) must travel less than 50 miles, but the second fuel truck (time cost metric measured in scenario F2) can only meet between 2 pm and 4 pm, then the locations that satisfy all of these constraints comprise the global criterion. Specifically, the global criterion above might look like:

G=(A>100) and ((F1<50) or ((F2>1400) and (F2<1600)))

The results of the global criterion are often a printed collection of setpoints, but alternatively they may be a highlighted region on a map. One could think of many useful ways to illustrate the solution.

In box 106, a specific rendezvous state is selected based on a selection criterion. Often this criterion is one which optimizes some collective cost or selects the minimum cost for the most critical of the scenarios. For example, if there are 20 possible rendezvous locations, the rendezvous location that minimizes the fuel consumption for a given actor may be most preferable. Alternatively, a random selection may take place if all rendezvous states are considered equivalent. Still another way to make a selection may be by human directive.

In box 107, selected information may be read out from the set of configuration spaces that represent the scenarios.

If a specific rendezvous state is selected, then paths leading from starting and goal states that lead to that rendezvous state can be read out from the configuration spaces. The path for a specific actor is found by first selecting the configuration space associated with the scenario that contained the start for that actor and tracing the path from the rendezvous state back to the start. Since the transitions would be listed in reverse order compared to how they would typically be carried out, the path should be reversed. From the specific rendezvous point, the remainder of the path for a specific actor is found by selecting the configuration space associated with the scenario that contained the goal for that actor and tracing the path from the rendezvous state back to the goal. Since the transitions would be listed in the order in which they would typically be carried out, the path need not be reversed.

If the costs associated with the path are required, they can be read out at a specific rendezvous state. For example, the cost from the start to the rendezvous state can be read out in the configuration space associated with the scenario that contains the goal for that actor. The cost from the rendezvous state to the goal an be read out in the configuration space associated with the scenario that contains the goal for that actor.

A simple example illustrating the steps given in FIG. 1 is described with reference to FIGS. 2–6. Tables 1–4 are specifications of scenarios as are needed in box 101 of FIG. 1. The obstacle layout necessary for the step in box 102 of FIG. 1 for the following simple example is presumed to be the same for each of the scenarios. In other scenarios, the obstacle layout for each scenario may be different, even if the terrain is the same. For example, a river may be an obstacle for a car that must drive along the banks and over bridges, however for a boat, the same terrain produces obstacles along the banks and low bridges.

Table 1 is a simplified specification of machine A, scenario. In this scenario, two start states are given, and the minimum distance criterion is selected as a metric. Naturally, other metrics may be selected including user-provided look-up tables and complex formulas.

TABLE 1

Scenario a1 /* actor a: scenario 1 */
Start /* tells whether to propagate away or towards the 'source' */
   3,2  /* equivalent locations that the actor could start from */
   1,3  /* coordinates are listed <row>,<column> */
Metric
   Min_distance /* horiz & vert. moves only, each move is cost=1 */

Figure 2:
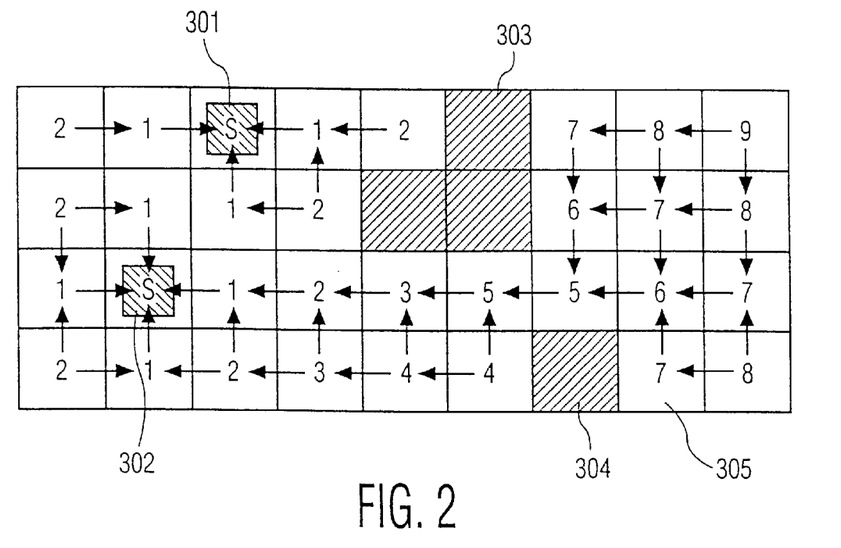
FIG. 2 is a diagram showing paths generated in a configuration space for a first actor using the scenario of Table 1.

FIG. 2 shows a simplified example of the paths generated using cost wave propagation in a configuration space with the scenario of Table 1. This corresponds to the method of box 103 in FIG. 1. The obstacles are three states in 303 and one in 304. The cost_from_start is given at each state. Direction arrows point into the equivalent starting states 301 and 302.

Table 2 is a simplified specification of machine A, scenario2. In this scenario, two goal states are given, and the minimum distance criterion is selected as a metric.

TABLE 2

Scenario a2/* actor a: scenario 2 */
Goal /* tells whether to propagate away or towards the 'source' * /
   4,8  /* equivalent goal locations that the actor could arrive at */
   1,7
Metric
   Min_distance /*horiz & vert. moves only, each move is cost=1 */

Figure 3:
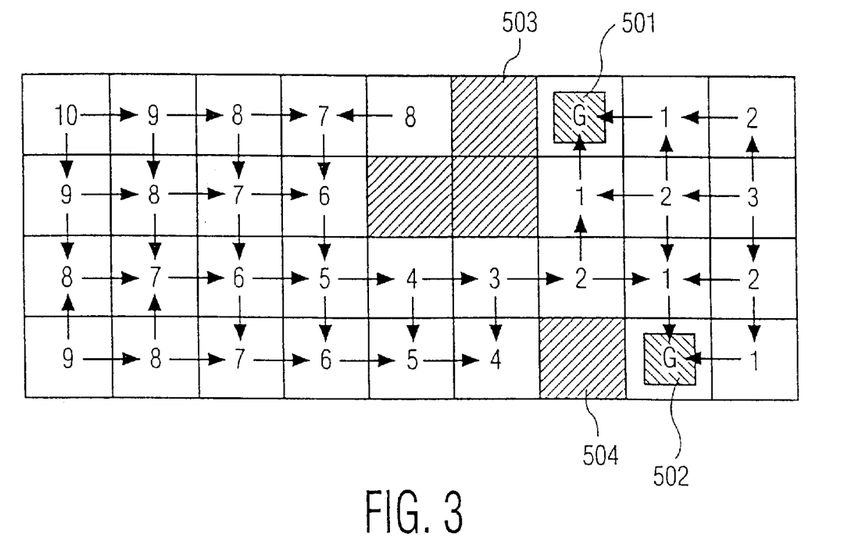
FIG. 3 is a diagram showing paths generated in a configuration space for the first actor using the scenario of Table 2.

FIG. 3 shows a simplified example of the paths generated using cost wave propagation in a configuration space with the scenario of Table 2. This corresponds to the method of box 103 in FIG. 1. The obstacles are three states in 503 and one in 504. Direction arrows point into the equivalent goal states 501 and 502.

Table 3 is a simplified specification of machine B, scenario1. In this scenario, two start states are given, and the minimum time criterion is selected as a metric.

TABLE 3

Scenario b1 /* actor b: scenario 1 */
Start /* propagate away from the 'source' */
   4,8  /* equivalent locations that the actor could start from */
   4,9  /* coordinates are listed <row>,<column> */
Metric
   Min_time /* horiz & vert. moves only, each move is cost=1 */

Figure 4:
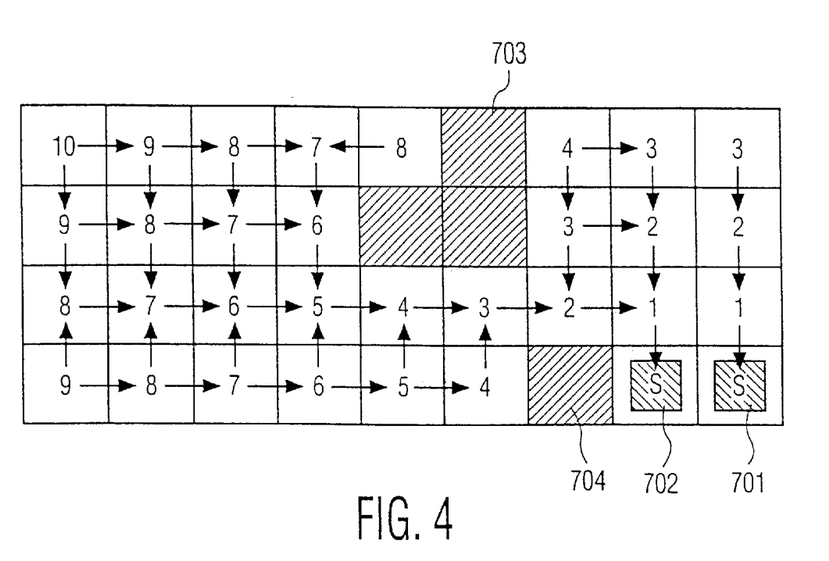
FIG. 4 is a diagram showing paths generated in a configuration space for a second actor using the scenario of Table 3.

FIG. 4 shows a simplified example of the paths generated using cost wave propagation in a configuration space with the scenario of Table 3. This corresponds to the method of box 103 in FIG. 1. The obstacles are three states in 703 and one in 704. Direction arrows point into the equivalent starting states 701 and 702.

Table 4 is a simplified specification of machine B, scenario2. In this scenario, two goal states are given, and the minimum fuel criterion is selected as a metric.

TABLE 4

Scenario b2/* actor b: scenario 2 */
Arrive /* propagate towards the 'source' */
   3,2  /* equivalent locations that the actor could start from */
   1,3  /* coordinates are listed <row>,<column> */
Metric
   Min_fuel /* horiz & vert. moves only, each move is cost=1 */

Figure 5:
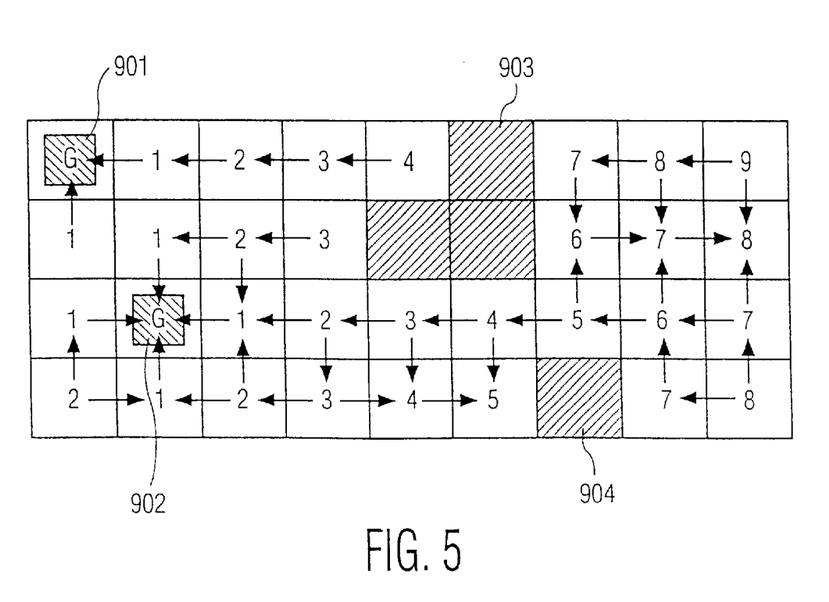
FIG. 5 is a diagram showing paths generated in a configuration space for the second actor using the scenario of Table 4.

FIG. 5 shows a simplified example of the paths generated using cost wave propagation in a configuration space with the scenario of Table 4. This corresponds to the method of box 103 in FIG. 1. The obstacles are three states in 903 and one in 904. Direction arrows point into the equivalent goal states 901 and 902.

The global constraint for this simple example is defined by the following Boolean expression:

$$(a1>2)\&(a1<=8)\&((a1+a2)=7)\&(b1<4)\&(b2>4)\&(a2+b2<9)\&((a2+b2)>6)$$

This is used to perform the method given in box 104 of FIG. 1. In this simple example, the global constraint is in effect saying that the rendezvous solution must satisfy the following criteria (restrictions):

1) the distance A travels from the start to the rendezvous state must be between (2,8].

AND 2) the distance A travels in total must be precisely 7.

AND 3) the time b travels from the start to the rendezvous state must be less than 4

AND

4) The fuel spent by b from the rendezvous state to the goal must be at least 4,

AND 5) the sum of the (distance travelled by a +the fuel spent by b) must be less than 9

AND 6) the sum of the (distance travelled by a +the fuel spent by b) must be greater than 6.

Any boolean combination is acceptable, including, but not limited to standard expressions which use the OR, and XOR operators, and any mathematical expressions as operands for comparison (i.e. >, =, or <) testing.

At each state, the global constraint is evaluated. It is more efficient, but not required, that the least computationally expensive and most likely to fail sub-expression be placed early in the constraint. This is because current compilers perform 'short circuit evaluation' where if it is possible to determine the final result of the expression before all the sub-expressions are evaluated, then the remainder are not tested.

If the global constraint results in TRUE, then the state is a rendezvous state.

Figure 6:
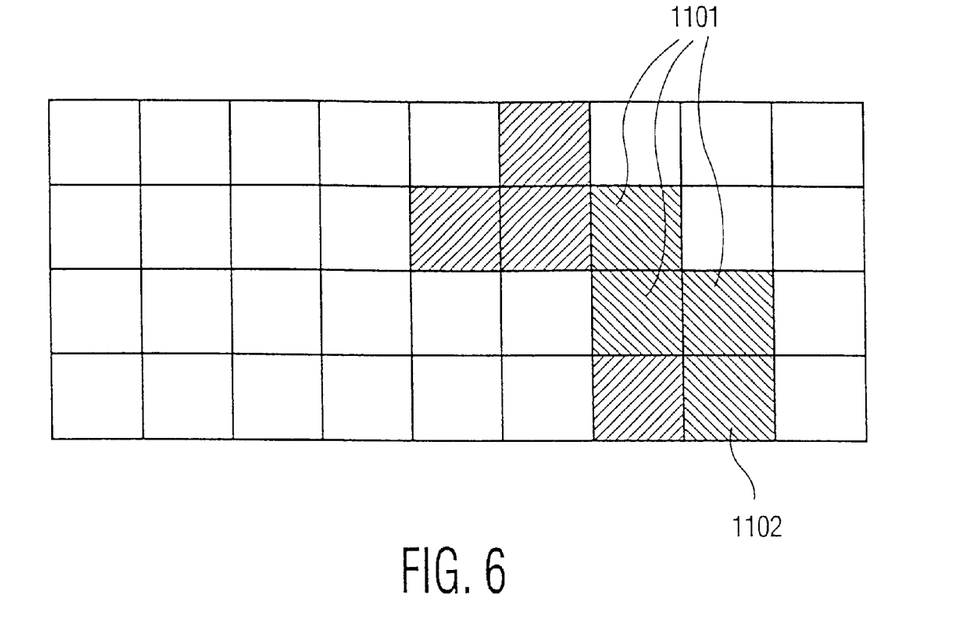
FIG. 6 is a diagram showing the rendezvous states found by evaluating the global constraints in the configuration spaces of FIGS. 2–5.

In FIG. 6, the states that satisfy the global constraint 1101 and 1102 are highlighted with a crosshatch. Alternatively, the coordinates can be output. This corresponds to the method specified in Box 105 of FIG. 1.

For any selected individual rendezvous state, the paths for each of the actors to follow from their respective starts to their respective goals can be retrieved by tracing from the rendezvous state in the respective configuration spaces.

For example, if the selected rendezvous state is 1102 of FIG. 6 having coordinate (4,8), then Actor A would follow from the staring state 302 in FIG. 2 at coordinate (3,2) to (3,3), (3,4), (3,5), (3,6), (3,7), (3,8), and finally to (4,8). Reiterating, this is achieved by tracing from rendezvous state 305 at coordinate (4,8) in FIG. 2, back to the nearest start, and then reversing the path. In addition to knowing the path, the cost to move from the start to the rendezvous state is 7. To find the path that Actor A should take to the goal from the rendezvous state 1102 of FIG. 6 is obtained by tracing from the coordinate (4,8) in FIG. 5 to the nearest goal. In this case, the actor is already at the goal 502, so no movement is necessary. The cost to get to the goal is zero.

Likewise, the paths and costs for Actor B can be found.

All of the paths and costs for all of the actors for each rendezvous state can be routinely displayed, or only selected ones.

Permissible Variations:

a) Mapping Common Task Spaces Between Machines (Actors)

In box 101 of FIG. 1, the configuration spaces for the various actors may be of different shapes and sizes, but there must be a mapping so that common regions can be identified. For example, one actor may be planning motions within New York, New Jersey, and Connecticut, while a second actor may plan motions within New York, New Jersey, Delaware, and Maryland. It is readily apparent that any rendezvous would occur in New York or New Jersey. To handle this type of problem, a method for mapping common areas must be provided. Non-common areas will still be required for the planning (i.e. methods 101, 102, and 103 of FIG. 1), although only common areas should be evaluated (the method in box 104 of FIG. 1) to find the states that might satisfy the global criterion.

Another common type of problem is one where multiple machines work in the same physical region (referred to as 'task space'), although their respective configuration spaces may look quite different (i.e. one machine may have 2 degrees of freedom, but another may have 3 degrees of freedom). The global criterion may specify docking distances between the machines for example. In addition, it is often possible to narrow down the region where a rendezvous could possibly take place, although it is not required. The expected rendezvous region would likely be a subset of the full task space. This expected rendezvous region must be transformed into the respective configuration spaces of each of the machines. This capability already exists since it is the same method needed to perform obstacle transformations. For each transformed state in the task space, the global criterion is evaluated.

b) Improved Efficiency When Fixed Combinations of Actors are Identified

When there are only two actors that have a global criterion that requires that they meet, then it is more efficient to eliminate all candidate rendezvous states where an obstacle is in the state of either actor for any scenario. On the other hand, if Actor A may meet with Actor B OR Actor C, then the strategy that requires non-obstacles in all scenarios before evaluating the criteria, would miss the rendezvous states where Actor B could rendezvous and C could not (and vice-versa). By identifying in advance the non-obstacle scenario patterns required, then this could further reduce the number of global criterion evaluations necessary.

c) Efficiency in Parallelism and Order of Operation

The Boxes 101, 102 and 103 of FIG. 1 can be processed in parallel for each scenario since the information contained in each is independent. Further, the operations contained in boxes 101 and 102 can be reversed or performed in parallel.

d) Differential Budding

Differential budding should be used to update the configuration spaces when there are any changes in the environment.

e) Multiple Constraints for the same Machine

Although the simple example used several machines, it is also possible to compute the solution for a single machine that has different types of constraints. For example, a car traveling to a fixed destination may wish to stop before the fuel_level is ¼ and at least 1 hour into the trip before continuing. The method described above integrates these needs. The locations to stop for fuel could then be found within the rendezvous region.

f) Rendezvous of People.

While most of the examples are for computing the rendezvous locations for machines, it is also desirable to be able to compute the rendezvous states (including location, time, etc.) for people. Each person may have a different ability to move based on terrain, and each person's physical capabilities (running speed, jumping distance, etc.). Based on the rendezvous states found, the people could be directed to follow their own specific paths.

g) Non-physical rendezvous states.

Most of the examples describe a physical meeting location that must be in common for a successful rendezvous. However a rendezvous may also have different simultaneous conditions. For example, a phone conversation requires that the time be simultaneous. If one assumes sparse phone distribution, then a plan must also incorporate information on locations of the possible phones. In this example, a variable at each configuration state identifying if there is a phone at that state could be used in a boolean expression representing the global constraint.

h) Early Stopping Criterion.

For each scenario, there is a configuration space for which wave propagation must take place. Wave propagation in prior patent applications could be stopped once the waves passed the starting state, because further computation would be fruitless. By stopping the wave propagation as early as possible, time can be saved. Similarly, if it were known that after a certain point in the wave propagation for rendezvous that the result of the calculation of the global criterion would always result in FALSE, then continuing wave propagation would also be fruitless, and therefore can be stopped. For example, suppose that the global criterion contained a required subexpression (ActorA_cost<50). In this example, cost wave propagation could be stopped once the value at the top of the heap (also happening to be the edge of the cost wave) reached 50. In general, subexpressions pertaining to only one actor-scenario can be used to stop the cost wave propagation early.

i) Relative Rendezvous states

In previously described scenarios, the task space was measured from a fixed frame of reference. Similar to the related application on controlling high speed vehicles, a frame of reference may be moving relative to the actors. Problems in docking moving vehicles may be addressed in this way. The method to find acceptable rendezvous states would be performed as previously described, with the only change being that the shared task space is determined based on a moving frame of reference. The candidate rendezvous states found will be relative to the moving frame of reference.

Apparatus Variations

Figure 7:
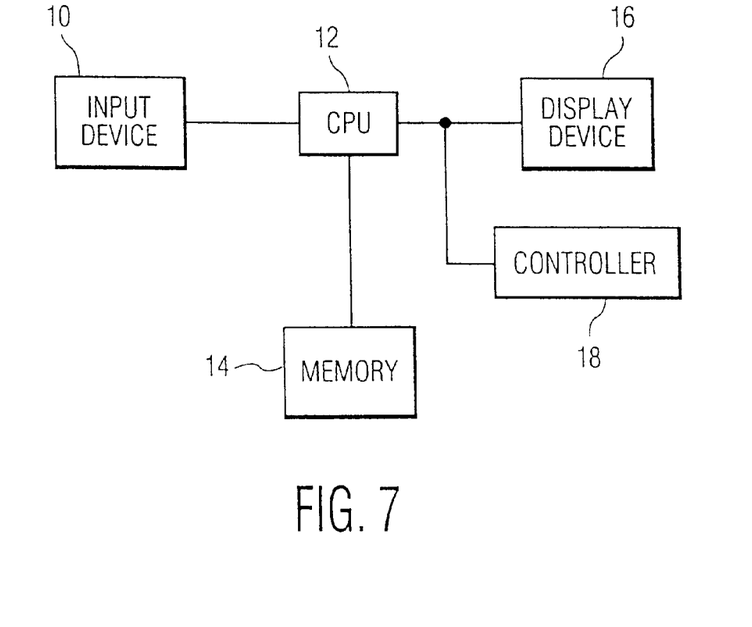
FIG. 7 is a block diagram of an apparatus for practicing the invention.

The method described above can be used with many different apparatus configurations. As shown in FIG. 7, what are required are an input device, a processing unit, and an output device. Input device 10 can be a keyboard, a mouse or light pen for locating positions on a map, a spoken-word recognition system, a radar output showing present position of actors and/or obstacles, or a computer system. The central processing unit 12 can be a dedicated calculating and logic unit, a "workstation" or microprocessor, or a more powerful computing machine. Memory 14 is optional, and might include 3-D map or chart data, or a storage device for actor (people or machines) capabilities and limitations. For output, a visual screen display 16 may provide information for a human to use in planning decisions, or may show the planned optimum routes to be taken by robots whose motions are controlled via a controller 18. Alternatively, rendezvous location lists can be printed, or the data can be provided to a computer for further use.

What is claimed is:

1. A computer method of identifying at least one rendezvous state that satisfies criteria for at least one actor, the method comprising executing the following operations in a data processing device:

defining a first scenario for travel to achieve a rendezvous condition;

embodying said first scenario in at least one computer readable medium;

defining at least one second scenario different from said first scenario for travel to achieve said rendezvous condition, embodying said at least one second scenario in at least one computer medium, forming at least respective first and second configuration space data structures based on said scenarios, said respective configuration space data structures being referred to herein as "configuration spaces" and having at least one task state in common, embodying said respective configuration spaces in at least one computer readable medium, propagating cost waves from a respective source for each configuration space, to determine costs for each configuration state corresponding to a said task state in common, embodying said costs in at least one computer readable medium, forming at least one Boolean expression defining at least one global criterion, embodying said Boolean expression in at least one computer readable median, for each said task state in common, evaluating costs of the corresponding configurations, according to said Boolean expression, to identify candidate rendezvous states, outputting from the data processing device an identification of said candidate rendezvous states.

2. The method as claimed in claim 1, wherein the respective source for one of said configuration spaces is a starting state for said actor, and the respective source for another of said configuration spaces is a goal state.

3. The method as claimed in claim 1, including stopping the propagation of waves when the global criterion cannot be true.

4. The method of claim 1 further comprising the step of controlling an object to move in accordance with the candidate rendezvous states.

5. The method as claimed in claim 1, wherein said at least one actor includes a first actor and a different actor, said first scenario is defined for said first actor, said second scenario is defined for said different actor, and said rendezvous condition is simultaneous presence of said first and different actors at a same task state.

6. The method of claim 5, wherein
propagating cost waves includes applying a respective criterion for each configuration space; and
said Boolean expression expresses a combination of all the respective criteria.

7. The method as claimed in claim 1, including the step of defining a third scenario for travel from said rendezvous condition to a goal, wherein the respective source for one of said configuration spaces is a starting state for said first actor, and the respective source for another of said configuration spaces is said goal.

8. The method as claimed in claim 7, wherein said goal is different from said starting state.

9. The method as claimed in claim 7, wherein said propagating step comprises:

a) propagating waves emanating from said starting state,
b) computing metrics by measuring transitions in reverse, and c) leaving direction arrows pointing toward the start.

10. The method of claim 1 wherein the identification is user-discernable.

11. The method of claim 10 wherein the object is a displayed object.

12. The apparatus of claim 11 wherein the object is a displayed object.

13. Data processing apparatus for identifying at least one rendezvous state which satisfies criteria for at least one actor, comprising:

a. at least one processor arranged to perform the following operations
   i. defining a first scenario, and at least one second scenario different from said first scenario, for travel to achieve a rendezvous condition,
   ii. forming respective configuration space data structures based on said scenarios, said data structures being referred to herein as respective configuration spaces, the respective configuration spaces having at least one task state in common,
   iii. propagating cost waves from a respective source for each respective configuration space, to determine costs of corresponding configuration states for each said task state in common,
   iv. forming at least one Boolean expression defining at least one global criterion,
   v. evaluating, for each said task state in common, said Boolean expression to identify candidate rendezvous states, b. at least one medium readable by said processor and embodying said first and at least one second scenarios, said respective configuration spaces, said costs, and said expression; and c. output means connected to the computer for providing an identification of said candidate rendezvous states.

14. The apparatus as claimed in claim 13, wherein the respective source for one of said configuration spaces is a starting state for said actor, and the respective source for another of said configuration spaces is a goal state.

15. The apparatus as claimed in claim 13, wherein the processor is further arranged for stopping the propagation of waves when the global criterion cannot be true.

16. The apparatus of claim 13 further wherein the processor is further arranged effect movement of an object in accordance with the candidate rendezvous states.

17. The apparatus as claimed in claim 13, wherein said at least one actor includes a first actor and a different actor, said first scenario is defined for said first actor, said second scenario is defined for said different actor, and said rendezvous condition is simultaneous presence of said first and different actors at a same configuration state.

18. The apparatus of claim 17, wherein
propagating cost waves includes applying a respective criterion for each configuration space; and
said Boolean expression expresses a combination of all the respective criteria.

19. The apparatus as claimed in claim 17, wherein said processor is further arranged for defining a third scenario for travel from said rendezvous condition to a goal, wherein the respective source for one of said configuration spaces is a starting state for said first actor, and the respective source for another of said configuration spaces is said goal.

20. The apparatus as claimed in claim 19, wherein said goal is different from said starting state.

21. The apparatus as claimed in claim 19, wherein propagating comprises:

a) propagating waves emanating from said starting state,
b) computing metrics by measuring transitions in reverse, and c) leaving direction arrows pointing toward the start.

22. Data processing apparatus for controlling travel of at least first and second actors to a rendezvous, comprising:
   a. at least one processor arranged to perform the following operations
      i. defining a first scenario associated with a first one of the actors, and at least one second scenario associated with at least one other of the actors and different from said first scenario, for travel to achieve a rendezvous condition,
      ii. forming respective configuration space data structures based on said scenarios, said respective data structures being referred to herein as respective configuration spaces, said respective configuration spaces having at least one task state in common,
      iii. propagating cost waves from a respective source for each configuration space, to determine costs for configuration states corresponding to each said task state in common,
      iv. forming at least one Boolean expression defining at least one global criterion,
      v. evaluating said Boolean expression, for each configuration state corresponding to a rendezvous task state in common, to identify candidate rendezvous states,
      vi. selecting one of said candidate rendezvous states,
      vii. determining a respective optimum path for each of said actors to the selected rendezvous state, based on said costs, and
   b. at least one medium readable by said processor and embodying said scenarios, said respective configuration spaces, said costs and said Boolean expression; and
   c. output means connected to the processor for providing respective travel control signals to said actors to follow the respective optimum paths.

23. The apparatus as claimed in claim 22, wherein the respective source for one of said configuration spaces is a starting state, and the respective source for another of said configuration spaces is a goal state.

24. The apparatus of claim 22 wherein the one of said actors is a displayed actor.

25. The apparatus of claim 22, wherein
   propagating cost waves includes applying a respective criterion for each configuration space; and
   said Boolean expression expresses a combination of all the respective criteria.

26. The apparatus as claimed in claim 22, wherein said first scenario is defined for the first actor, said second scenario is defined for the second actor, and said rendezvous condition is simultaneous presence of said first and second actors at a same configuration state.

27. The apparatus as claimed in claim 26, wherein
   the processor is further arranged for defining a third scenario for travel from said rendezvous condition to a goal,
   the respective source for one of said configuration spaces is a starting state for said first actor, and
   the respective source for another of said configuration spaces is said goal, and
   said output means further provides travel control signals to one of said actors for travel from said rendezvous condition to said goal.

28. The apparatus of claim 22 wherein the output means comprises at least one controller for controlling movement of one of said actors.

29. The apparatus as claimed in claim 22, wherein one of said actors is a robot, and said controller controls movement of said robot.

* * * * *